(12) United States Patent
Hsu

(10) Patent No.: US 11,329,562 B1
(45) Date of Patent: May 10, 2022

(54) CONSTANT ON-TIME BUCK CONVERTER WITH IMPROVED TRANSIENT RESPONSE

(71) Applicant: Elite Semiconductor Microelectronics Technology Inc., Hsinchu (TW)

(72) Inventor: Che-Wei Hsu, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 82 days.

(21) Appl. No.: 17/092,310

(22) Filed: Nov. 8, 2020

(51) Int. Cl.
*H02M 3/158* (2006.01)
*H03K 5/24* (2006.01)
*H02M 1/08* (2006.01)
*G01R 19/165* (2006.01)
*H02M 1/00* (2006.01)

(52) U.S. Cl.
CPC ...... *H02M 3/158* (2013.01); *G01R 19/16538* (2013.01); *H02M 1/08* (2013.01); *H03K 5/24* (2013.01); *H02M 1/0025* (2021.05)

(58) Field of Classification Search
None
See application file for complete search history.

(56) References Cited

U.S. PATENT DOCUMENTS

| | | | |
|---|---|---|---|
| 7,646,185 B2 * | 1/2010 | Kim | H02M 3/1588 323/283 |
| 9,252,757 B2 | 2/2016 | Chao | |
| 9,685,865 B2 * | 6/2017 | Nagasawa | H02M 3/1584 |
| 9,774,255 B2 | 9/2017 | Xi | |
| 10,148,176 B2 | 12/2018 | Chen | |
| 10,468,986 B2 | 11/2019 | Kuo | |
| 10,680,522 B2 | 6/2020 | Fukumoto | |
| 2019/0319540 A1 | 10/2019 | Arno | |
| 2020/0136496 A1 * | 4/2020 | Yamaguchi | B60R 16/033 |
| 2021/0242773 A1 * | 8/2021 | Mei | H03K 5/24 |

FOREIGN PATENT DOCUMENTS

TW I538372 B 6/2016

* cited by examiner

*Primary Examiner* — Jeffrey A Gblende
(74) *Attorney, Agent, or Firm* — Winston Hsu

(57) ABSTRACT

A COT (constant on-time) buck converter includes a first transistor, a second transistor, a driver circuit, an inductor, a first resistor, a second resistor, a capacitor, a load, and a feedback loop circuit. The feedback loop circuit includes a first switch, a second switch, an error amplifier, a comparator, a frequency locked loop circuit, an inverter and a COT logic circuit. The COT buck converter is able to improve DC (direct-current) regulation efficiency and transient response time.

5 Claims, 3 Drawing Sheets

CONSTANT ON-TIME BUCK CONVERTER WITH IMPROVED TRANSIENT RESPONSE

BACKGROUND OF THE INVENTION

1. Field of the Invention

The present invention is related to a COT (constant on-time) buck converter, and more particularly to a COT buck converter with improved transient response.

2. Description of the Prior Art

The operation of the conventional buck converter is well known and is described as follows. A conventional buck converter includes a pair of power transistors as switches which are turned on and off to regulate an output voltage to be equal to a reference voltage. More specifically, the power transistors are alternately turned on and off to generate a switching output voltage at a switching output node, also referred to as the switch node. The switch node is coupled to an LC filter circuit including an inductor and a capacitor to generate an output voltage having substantially constant magnitude. The output voltage can then be used to drive a load.

FIG. 1 is a diagram of a conventional buck converter 1 of the prior art. A buck converter 1 includes a pair of power transistors T1 and T2 for receiving an input voltage $V_{IN}$ and are alternately turned on and off to generate a switching output voltage $V_{SW}$ at a switch node SW. The switching output voltage $V_{SW}$ is directly coupled to an LC filter circuit including an inductor L1 and a capacitor $C_{OUT}$ to generate a regulated output voltage $V_{OUT}$ at a node OUT having a substantially constant magnitude. The output voltage $V_{OUT}$ can then be used to drive a load 30 whereby the buck converter 1 provides the load current $I_{Load}$ to maintain the output voltage $V_{OUT}$ at a constant level.

The buck converter 1 includes a feedback control circuit to regulate the energy transfer to the LC filter circuit to maintain the constant output voltage within the desired load limits of the circuit. More specifically, the feedback control circuit causes power transistor T1 and T2 to turn on and off to regulate the output voltage $V_{OUT}$ to be equal to a reference voltage $V_{REF}$ or to a voltage value related to the reference voltage $V_{REF}$. In the buck converter 1, a voltage divider including resistors R1 and R2 is used to divide down the output voltage $V_{OUT}$ which is then fed back to the buck converter 1 as a feedback voltage $V_{FB}$ on a feedback node FB. The feedback voltage $V_{FB}$ is compared with the reference voltage $V_{REF}$ at an error processing circuit, such as a comparator 12. The output of the comparator 12 is coupled to a driver circuit 14 to generate control voltages for the power transistors based on a switching regulator control scheme. The control voltages are used to generate gate drive signals for the power transistor T1 and T2.

COT (constant on-time) buck converters are one type of buck converters employing ripple-mode control where the output voltage is regulated based on the ripple component in the output signal. Because of the switching action at the power transistors, all switch-mode regulators generate an output ripple current through the switched output inductor. This current ripple manifests itself as an output voltage ripple due to the equivalent series resistance (ESR) and the equivalent series inductance (ESL) in the output capacitor $C_{OUT}$ placed in parallel with the load. The ESR and the ESL of the output capacitor $C_{OUT}$ are respectively denoted as a resistor $R_{ESR}$ and an inductor $L_{ESL}$ in FIG. 1.

COT buck converters are widely used in the industry for some important advantages such as fast transient response and easy control of regulating a high input voltage to a low output voltage. However, conventional COT buck converter presents a few disadvantages including jittering behavior due to low noise immunity and poor DC (direct-current) regulation and transient response.

SUMMARY OF THE INVENTION

An embodiment provides a COT (Constant on time) buck converter including a first transistor, a second transistor, a driver circuit, an inductor, a first resistor, a second resistor, a capacitor, a load, and a feedback control circuit. The feedback control circuit includes a first switch, a second switch, an error amplifier, a comparator, a frequency locked loop circuit, an inverter and a COT logic circuit. The first transistor includes a first terminal for receiving an input voltage, a second terminal coupled to a switch node, and a control terminal. The second transistor includes a first terminal coupled to the switch node, a second terminal couple to a voltage ground, and a control terminal. The driver circuit is coupled to the control terminal of the first transistor and the control terminal of the second transistor, and the driver circuit is for controlling the first transistor and the second transistor. The inductor includes a first end coupled to the switch node, and a second end coupled to an output node. The first resistor includes a first end coupled to the output node, and a second end coupled to a feedback node. The second resistor includes a first end coupled to the feedback node, and a second end coupled to the voltage ground. The capacitor includes a first end coupled to the output node, and a second end coupled to the voltage ground. The load includes a first end coupled to the output node, and a second end coupled to the voltage ground. The first switch includes a first terminal coupled to the feedback node, a second terminal, and a control terminal. The second switch includes a first terminal coupled to the second terminal of the first switch, a second terminal, and a control terminal. The error amplifier includes a negative input terminal coupled to the second terminal of the first switch, a positive input terminal for receiving a reference voltage, and an output terminal coupled to the second terminal of the second switch for outputting an error signal. The comparator is for comparing the error signal and a feedback voltage at the feedback node and outputting a comparison signal. The frequency locked loop circuit is for generating a frequency signal. The inverter includes an input end coupled to the frequency locked loop circuit and the control terminal of the second switch, and an output end coupled to the control terminal of the first switch. The COT logic circuit is for receiving the frequency signal and the comparison signal and generating a COT signal to the driver circuit.

These and other objectives of the present invention will no doubt become obvious to those of ordinary skill in the art after reading the following detailed description of the preferred embodiment that is illustrated in the various figures and drawings.

DETAILED DESCRIPTION

The present disclosure may be understood by reference to the following detailed description, taken in conjunction with the drawings as described below, and for purposes of illustrative clarity and being easily understood by the readers, various drawings of this disclosure may be simplified, and the elements in various drawings may not be drawn to scale. In addition, the number and dimension of each element shown in drawings are just illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function. In the following description and in the claims, the terms "comprise", "include" and "have" are used in an open-ended fashion, and thus should be interpreted to mean "include, but not limited to . . . ".

Figure 1:
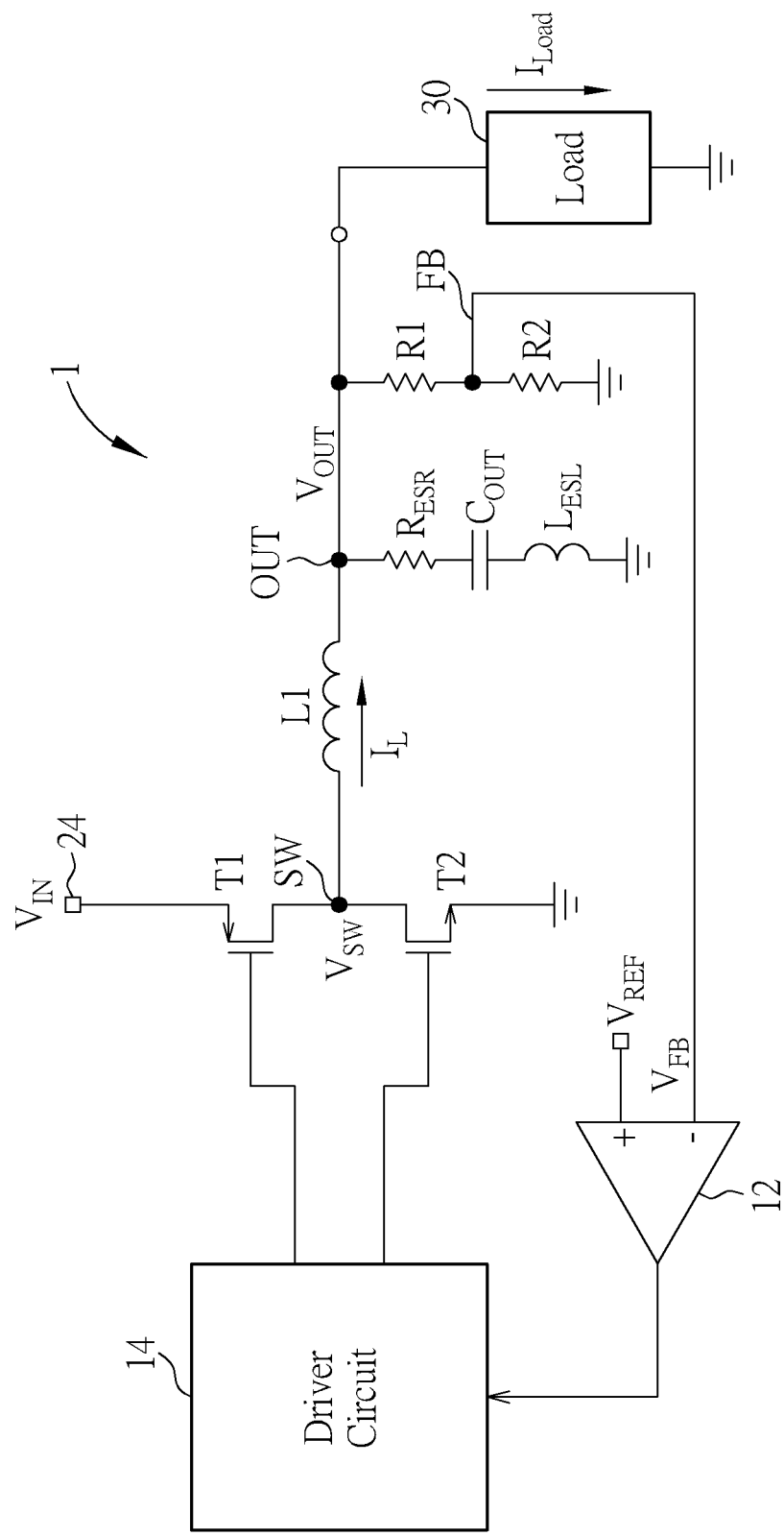
FIG. 1 is a diagram of a conventional buck converter of the prior art.
Figure 2:
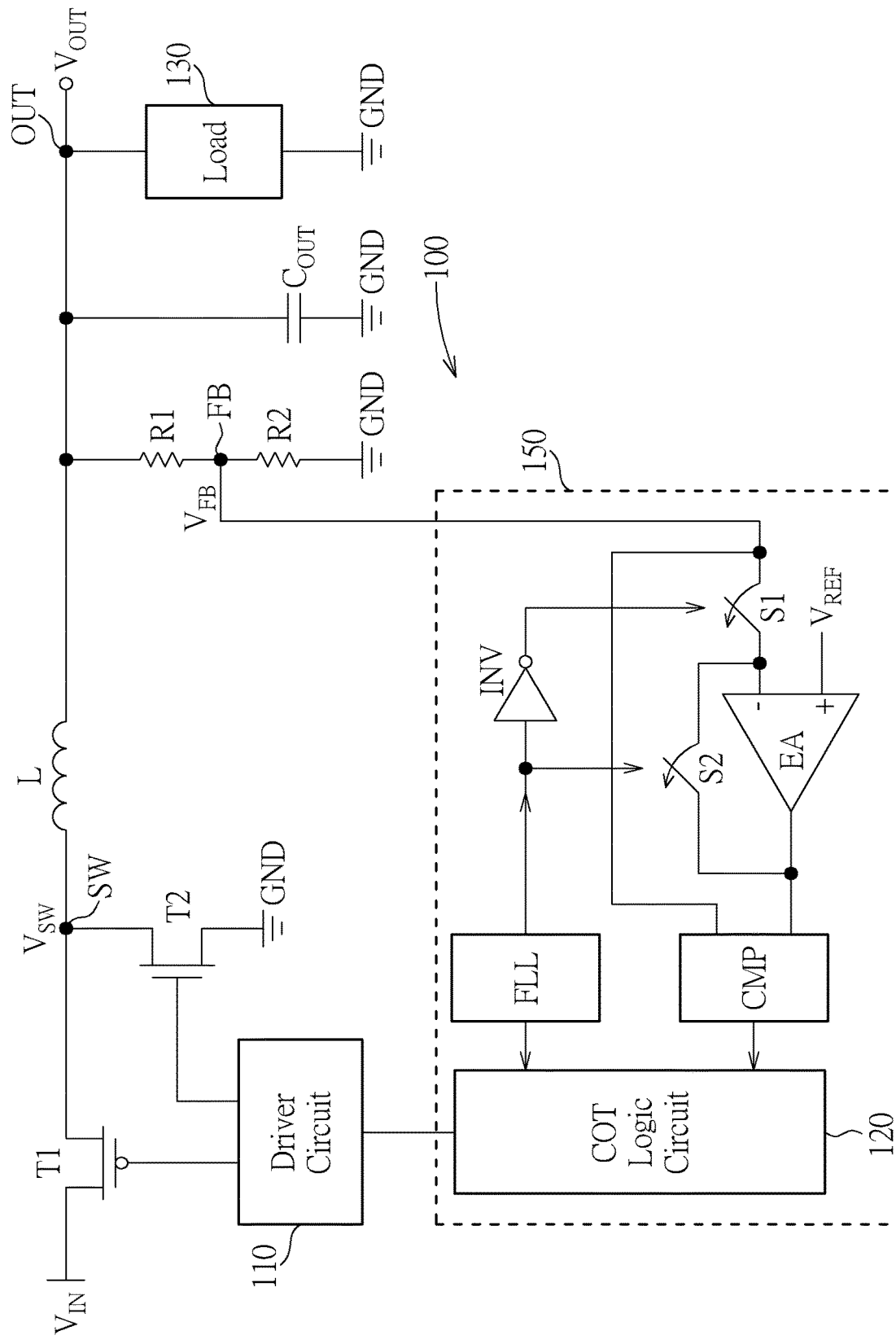
FIG. 2 is a diagram of a COT buck converter of an embodiment of the present invention.

FIG. 2 is a diagram of a COT (constant on-time) buck converter 100 of an embodiment of the present invention. The COT buck converter 100 includes a first transistor T1, a second transistor T2, a driver circuit 110, an inductor L, a first resistor R1, a second resistor R2, a capacitor $C_{OUT}$, a load 130, a feedback control circuit 150. The feedback control circuit 150 includes a first switch S1, a second switch S2, an error amplifier EA, a comparator CMP, a frequency locked loop circuit FLL, an inverter INV and a COT logic circuit 120.

The first transistor T1 includes a first terminal for receiving an input voltage $V_{IN}$, a second terminal coupled to a switch node SW, and a control terminal. The second transistor T2 includes a first terminal coupled to the switch node SW, a second terminal coupled to a voltage ground GND, and a control terminal. The driver circuit 110 is coupled to the control terminal of the first transistor T1 and the control terminal of the second transistor T2, and the driver circuit 110 is for controlling the first transistor T1 and the second transistor T2. The inductor L includes a first end coupled to the switch node SW, and a second end coupled to an output node OUT. The first resistor R1 includes a first end coupled to the output node OUT, and a second end coupled to a feedback node FB. The second resistor R2 includes a first end coupled to the feedback node FB, and a second end coupled to the voltage ground GND. The capacitor $C_{OUT}$ includes a first end coupled to the output node OUT, and a second end coupled to the voltage ground GND. The load 130 includes a first end coupled to the output node OUT, and a second end coupled to the voltage ground GND. The first switch S1 includes a first terminal coupled to the feedback node FB, a second terminal, and a control terminal. The second switch S2 includes a first terminal coupled to the second terminal of the first switch S1, a second terminal, and a control terminal. The error amplifier EA includes a negative input terminal coupled to the second terminal of the first switch S1, a positive input terminal for receiving a reference voltage $V_{REF}$, and an output terminal coupled to the second terminal of the second switch S2 for outputting an error signal. The comparator CMP is for comparing the error signal and a feedback voltage $V_{FB}$ at the feedback node FB and outputting a comparison signal. The frequency locked loop circuit FLL is for generating a frequency signal. The inverter INV includes an input end coupled to the frequency locked loop circuit FLL and the control terminal of the second switch S2, and an output end coupled to the control terminal of the first switch S1. The COT logic circuit 120 is for receiving the frequency signal and the comparison signal and generating a COT signal to the driver circuit 110.

In the embodiment, the first switch S1 and the second switch S2 are metal-oxide-semiconductor field-effect transistors (MOSFET). However, in other embodiments, the first switch S1 and the second switch S2 can be bipolar junction transistors. In the embodiment, the first transistor T1 is a P-type transistor. The second transistor T2 is an N-type transistor. The exact implementation of the switches S1 and S2 and the transistors T1 and T2 is not critical to the practice of the present invention.

The transistors T1 and T2 can receive an input voltage $V_{IN}$ and are alternately turned on and off to generate a switching voltage $V_{SW}$ at the switch node SW. The switch node SW is directly coupled to an LC filter circuit including an inductor L and a capacitor $C_{OUT}$ to generate the regulated output voltage $V_{OUT}$ driving the load 130 and having a substantially constant magnitude at the output node OUT.

The COT buck converter 100 includes the feedback control circuit 150 to regulate the energy transfer to the LC filter circuit to maintain the constant output voltage within the desired load limits of the circuit. More specifically, the feedback control circuit 150 causes the transistors T1 and T2 to turn on and off to regulate the output voltage $V_{OUT}$ to be equal to a reference voltage $V_{REF}$ or to a voltage value related to the reference voltage $V_{REF}$. A voltage divider including the first resistor R1 and the second resistor R2 is used to divide down the output voltage $V_{OUT}$ which is then fed back to the feedback control circuit 150 as the feedback voltage $V_{FB}$ on a feedback node FB. At the feedback control circuit 150, while at steady state, the first switch S1 is electrically connected and the second switch S2 is electrically disconnected. The feedback voltage $V_{FB}$ is compared with the reference voltage $V_{REF}$ using the error amplifier EA. The error signal outputted by the error amplifier EA is fed to the comparator CMP and comparing with the feedback voltage $V_{FB}$. The COT logic circuit 120 then uses the resulting comparison signal from the comparator CMP and the frequency signal from the frequency locked loop circuit FLL to generate the COT (constant on-time) signal to the driver circuit 110. The driver circuit 110 generates control signals for the transistors T1 and T2 based on a constant on-time control scheme according to the COT signal.

To implement constant on-time feedback control where the switching action is based on the ripple component in the feedback voltage $V_{FB}$, the switching voltage $V_{SW}$ is switched to high for a fixed on-time when the feedback ripple falls below a single reference voltage $V_{REF}$. At the end of the fixed on-time, the switching voltage $V_{SW}$ is switched to low (the inductor not energized) until the feedback voltage $V_{FB}$ falls again below the reference voltage $V_{REF}$. At this point a new fixed on-time is initiated. If the feedback voltage $V_{FB}$ is still below the reference voltage $V_{REF}$, the switching voltage $V_{SW}$ is switched to low only for a minimum off-time before getting switched back high for the fixed on-time again.

Figure 3:
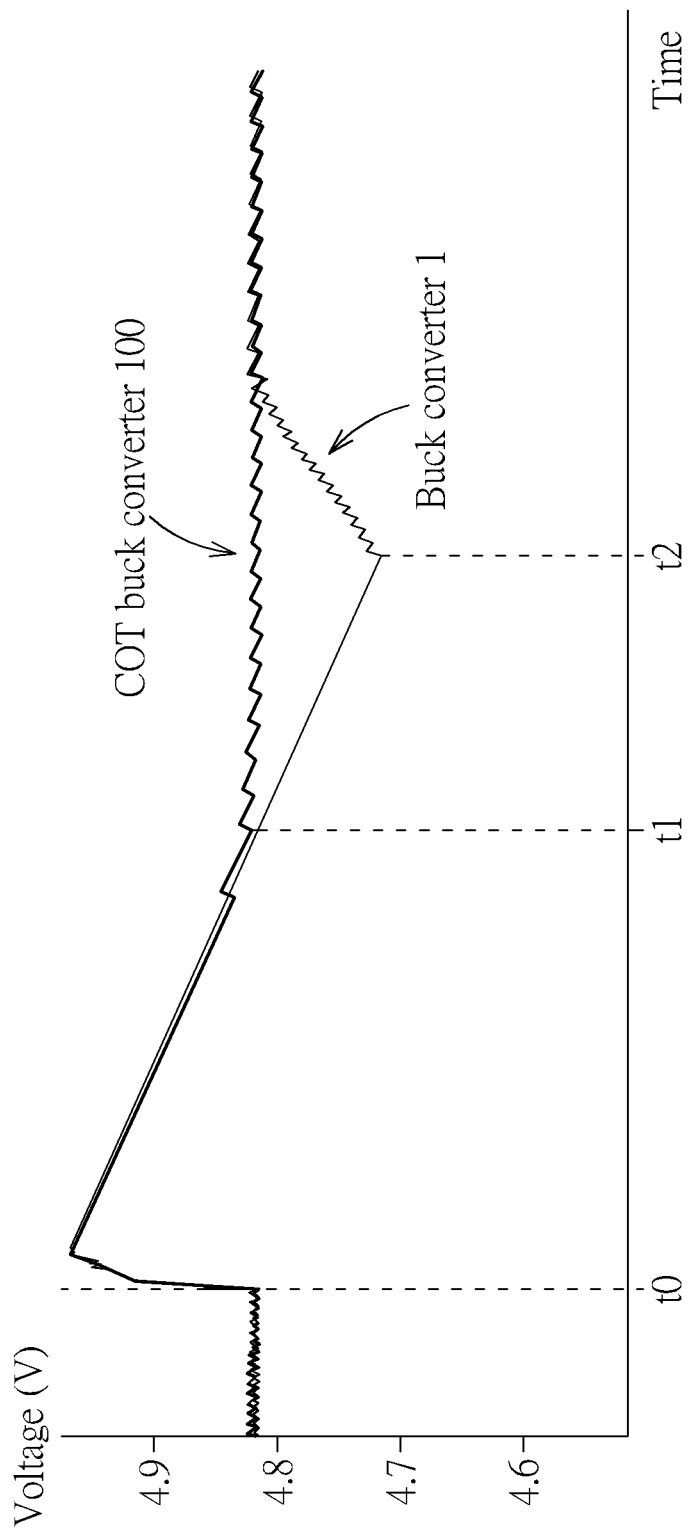
FIG. 3 is a timing diagram of the output voltage signal of FIG. 2.

FIG. 3 is a timing diagram of the output voltage signal $V_{OUT}$ of FIG. 2. The transient response can be improved by the configuration of the feedback control circuit 150. At steady state, the first switch S1 is electrically connected and the second switch S2 is electrically disconnected. When the switching voltage $V_{SW}$ is switched at time t0, the output voltage $V_{OUT}$ is boosted, for example, from 4.82V to 4.98V. At this time, the frequency locked loop circuit FLL sends a frequency signal to connect the second switch S2 and disconnect the first switch S1 through the inverter INV. This results in setting the error amplifier EA to unity gain, which means the error signal outputted by the error amplifier EA equals to the voltage at the negative input terminal of the error amplifier EA. By setting the error amplifier EA to unity gain, the COT buck converter 100 can have faster transient response.

As shown in FIG. 3, the COT buck converter 100 can gradually regulate the output voltage $V_{OUT}$ from 4.98V back to 4.82V with fast transient response. When the output voltage $V_{OUT}$ is regulated back to 4.82V at time t1, the frequency locked loop circuit FLL sends another signal to disconnect the second switch S2 and connect the first switch S1. This would cause the COT buck converter 100 to operate again at steady state.

Also shown in FIG. 3, the buck converter 1 of the prior art would down regulate to the output voltage $V_{OUT}$ to a lower voltage of 4.72V, for example, and then at time t2, it would slowly adjust the output voltage $V_{OUT}$ back to 4.82V. Comparing with the buck converter 1 of the prior art, the COT buck converter 100 presents an improved transient response time to output voltage change.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A COT (constant on-time) buck converter comprising:
   a first transistor comprising:
      a first terminal for receiving an input voltage;
      a second terminal coupled to a switch node; and
      a control terminal;
   a second transistor comprising:
      a first terminal coupled to the switch node;
      a second terminal couple to a voltage ground; and
      a control terminal;
   a driver circuit coupled to the control terminal of the first transistor and the control terminal of the second transistor, and configured to control the first transistor and the second transistor;
   an inductor comprising:
      a first end coupled to the switch node; and
      a second end coupled to an output node;
   a first resistor comprising:
      a first end coupled to the output node; and
      a second end coupled to a feedback node;
   a second resistor comprising:
      a first end coupled to the feedback node; and
      a second end coupled to the voltage ground;
   a capacitor comprising:
      a first end coupled to the output node; and
      a second end coupled to the voltage ground;
   a load comprising:
      a first end coupled to the output node; and
      a second end coupled to the voltage ground; and
   a feedback control circuit comprising:
      a first switch comprising:
         a first terminal coupled to the feedback node;
         a second terminal; and
         a control terminal;
      a second switch comprising:
         a first terminal coupled to the second terminal of the first switch;
         a second terminal; and
         a control terminal;
      an error amplifier comprising:
         a negative input terminal coupled to the second terminal of the first switch;
         a positive input terminal for receiving a reference voltage; and
         an output terminal coupled to the second terminal of the second switch for outputting an error signal;
      a comparator configured to compare the error signal and a feedback voltage at the feedback node and to output a comparison signal;
      a frequency locked loop circuit configured to generate a frequency signal;
      an inverter comprising:
         an input end coupled to the frequency locked loop circuit and the control terminal of the second switch; and
         an output end coupled to the control terminal of the first switch; and
      a COT logic circuit configured to receive the frequency signal and the comparison signal and generate a COT signal to the driver circuit.

2. The COT buck converter of claim 1, wherein the first switch and the second switch are metal-oxide-semiconductor field-effect transistors (MOSFET).

3. The COT buck converter of claim 1, wherein the first switch and the second switch are bipolar junction transistors (BJT).

4. The COT buck converter of claim 1, wherein the first transistor is a P-type transistor.

5. The COT buck converter of claim 1, wherein the second transistor is an N-type transistor.

* * * * *